United States Patent
Zha et al.

(10) Patent No.: US 7,760,501 B2
(45) Date of Patent: Jul. 20, 2010

(54) HEAT DISSIPATION APPARATUS

(75) Inventors: Xin-Xiang Zha, Shenzhen (CN); Shu-Min Li, Shenzhen (CN); Shu-Yuan Xu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/266,568

(22) Filed: Nov. 7, 2008

(65) Prior Publication Data

US 2010/0097762 A1    Apr. 22, 2010

(30) Foreign Application Priority Data

Oct. 16, 2008    (CN) .................. 2008 1 0304949

(51) Int. Cl.
    *H05K 7/20* (2006.01)
(52) U.S. Cl. .................. 361/697; 361/695; 361/679.47; 361/701; 361/702; 361/696; 165/80.3; 165/104.33; 165/121; 165/125
(58) Field of Classification Search ............ 361/679.46, 361/679.47, 679.52, 692–697, 702–712; 165/80.3, 104.21, 104.26, 104.33, 104.34, 165/185; 257/706–727; 174/15.1, 16.3, 174/252
See application file for complete search history.

(56) References Cited

U.S. PATENT DOCUMENTS

| | | | | |
|---|---|---|---|---|
| 6,419,007 B1 * | 7/2002 | Ogawara et al. | ........... | 165/80.3 |
| 6,671,172 B2 * | 12/2003 | Carter et al. | ................. | 361/697 |
| 7,011,147 B1 * | 3/2006 | Hung | ..................... | 165/104.33 |
| 7,063,130 B2 * | 6/2006 | Huang | ......................... | 165/121 |
| 7,120,020 B2 * | 10/2006 | Carter et al. | ................. | 361/697 |
| 7,163,050 B2 * | 1/2007 | Wang et al. | ............. | 165/104.33 |
| 7,200,934 B2 * | 4/2007 | Carter et al. | ............. | 29/890.03 |
| 7,515,417 B2 * | 4/2009 | Lee et al. | ..................... | 361/700 |
| 2005/0280992 A1 * | 12/2005 | Carter et al. | ................. | 361/697 |
| 2007/0193718 A1 * | 8/2007 | Carter et al. | ............... | 165/80.3 |
| 2008/0024994 A1 * | 1/2008 | Cheng | ......................... | 361/710 |
| 2008/0202729 A1 * | 8/2008 | Mochizuki | ............. | 165/104.14 |
| 2009/0242176 A1 * | 10/2009 | Liu et al. | ............... | 165/104.33 |

* cited by examiner

*Primary Examiner*—Michael V Datskovskiy
(74) *Attorney, Agent, or Firm*—Frank R. Niranjan

(57) ABSTRACT

A heat dissipation apparatus includes a heat sink (30) and a fan (50) mounted on the heat sink. The heat sink includes a plurality of radial fins (311, 331). An air channel (312, 332) is defined between every two adjacent fins. Each of the fins includes a main body (331, 331) and an airflow guiding flange (314, 334) extending upwardly and outwardly from a top side of the main body. The airflow guiding flange is twisted in a radial direction, such that an included angle between the airflow guiding flange and the main body is gradually increased from an outer side (318, 338) towards an inner side (317, 337) of the main body. The fan is used to generate airflow towards the heat sink. The airflow is guided into the air channels between the fins via the airflow guiding flanges.

9 Claims, 5 Drawing Sheets

HEAT DISSIPATION APPARATUS

CROSS-REFERENCE TO RELATED APPLICATION

Relevant subject matter is disclosed in co-pending U.S. patent application Ser. No. 12/252,377, filed on Oct. 16, 2008 and having a same title with the present application, both of which are assigned to the same assignee as the present application. The disclosure of the co-pending application is incorporated herein by reference.

BACKGROUND

1. Technical Field

The disclosure generally relates to heat dissipation, and particularly to a heat dissipation apparatus utilizing a plurality of radial fins for dissipating heat generated by electronic components.

2. Description of Related Art

It is well known that if heat generated by electronic components such as integrated circuit chips during operation is not efficiently removed, these electronic components may suffer damage. Thus, heat dissipation apparatuses are often used to cool the electronic components.

A typical heat dissipation apparatus includes a heat sink and a fan mounted thereon. The heat sink includes a heat conductive core thermally connecting with an electronic component and a plurality of fins extending radially and outwardly from the heat conductive core. During operation, the heat conductive core transfers heat from the electronic component to the fins. The fan generates airflow towards the fins to dissipate heat therefrom.

In the heat dissipation apparatus, since the airflow leaves the fan in a downward spiral pattern and the fins are vertical flat plates, it is difficult for the airflow from the fan to enter air channels between the fins. Thus, heat dissipation efficiency of the heat dissipation apparatus is reduced.

What is needed, therefore, is a heat dissipation apparatus which overcomes the described limitations.

SUMMARY

A heat dissipation apparatus according to an embodiment of the disclosure includes a heat sink and a fan mounted on the heat sink. The heat sink includes a plurality of radial fins. An air channel is defined between every two adjacent fins. Each of the fins includes a main body and an airflow guiding flange extending upwardly and outwardly from a top side of the main body. The airflow guiding flange is twisted in a radial direction, such that an included angle between the airflow guiding flange and the main body is gradually increased from an outer side towards an inner side of the main body. The fan is used to generate airflow towards the heat sink. The airflow is guided into the air channels between the fins via the airflow guiding flanges.

Other advantages and novel features of the disclosure will become more apparent from the following detailed description when taken in conjunction with the accompanying drawings.

BRIEF DESCRIPTION OF THE DRAWINGS

Many aspects of the present heat dissipation apparatus can be better understood with reference to the following drawings. The components in the drawings are not necessarily drawn to scale, the emphasis instead being placed upon clearly illustrating the principles of the disclosed heat dissipation apparatus. Moreover, in the drawings, like reference numerals designate corresponding parts throughout the several views.

DETAILED DESCRIPTION OF THE EMBODIMENTS

Figure 1:
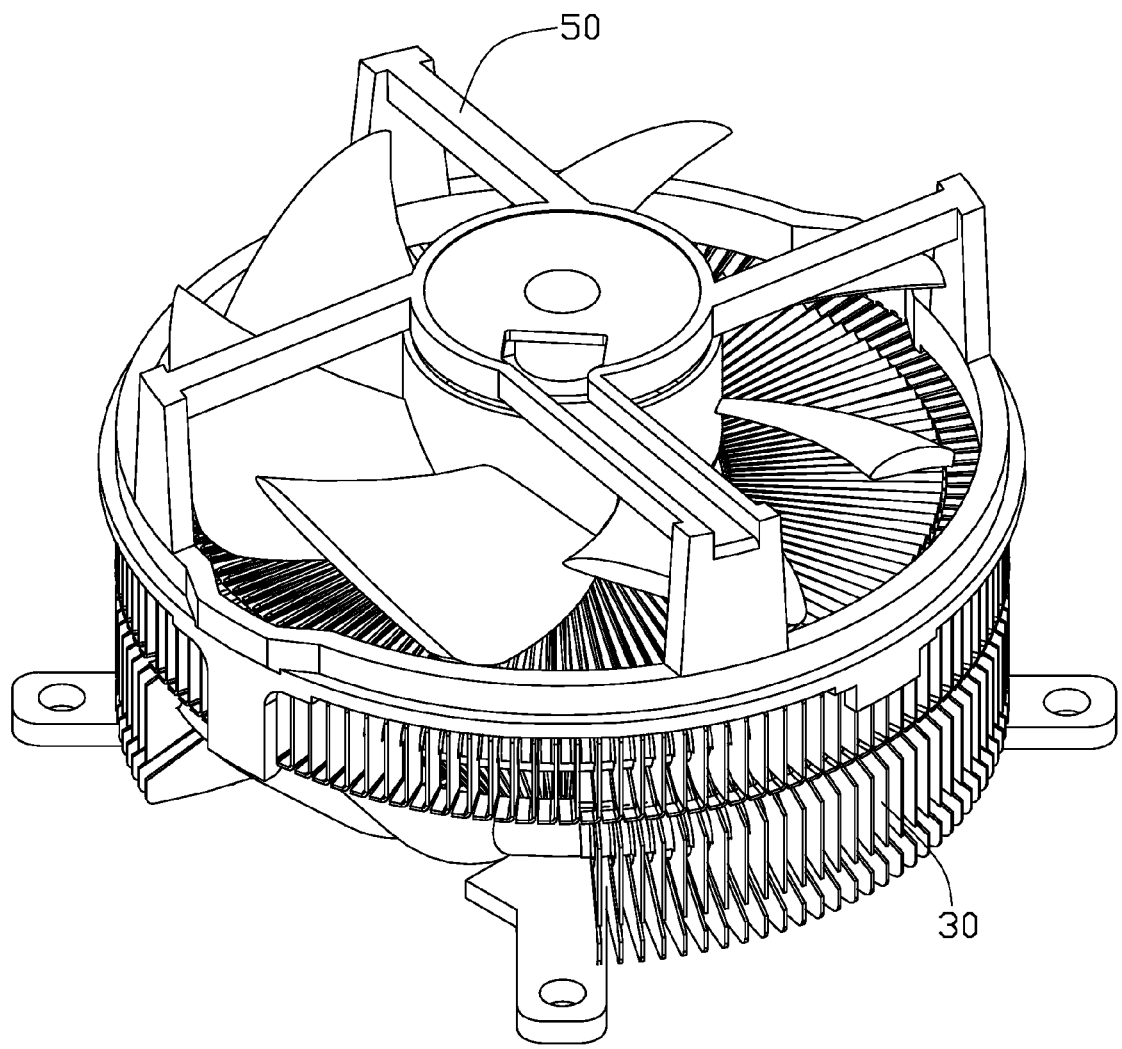
FIG. 1 is an assembled, isometric view of a heat dissipation apparatus in accordance with one embodiment of the disclosure.
Figure 2:
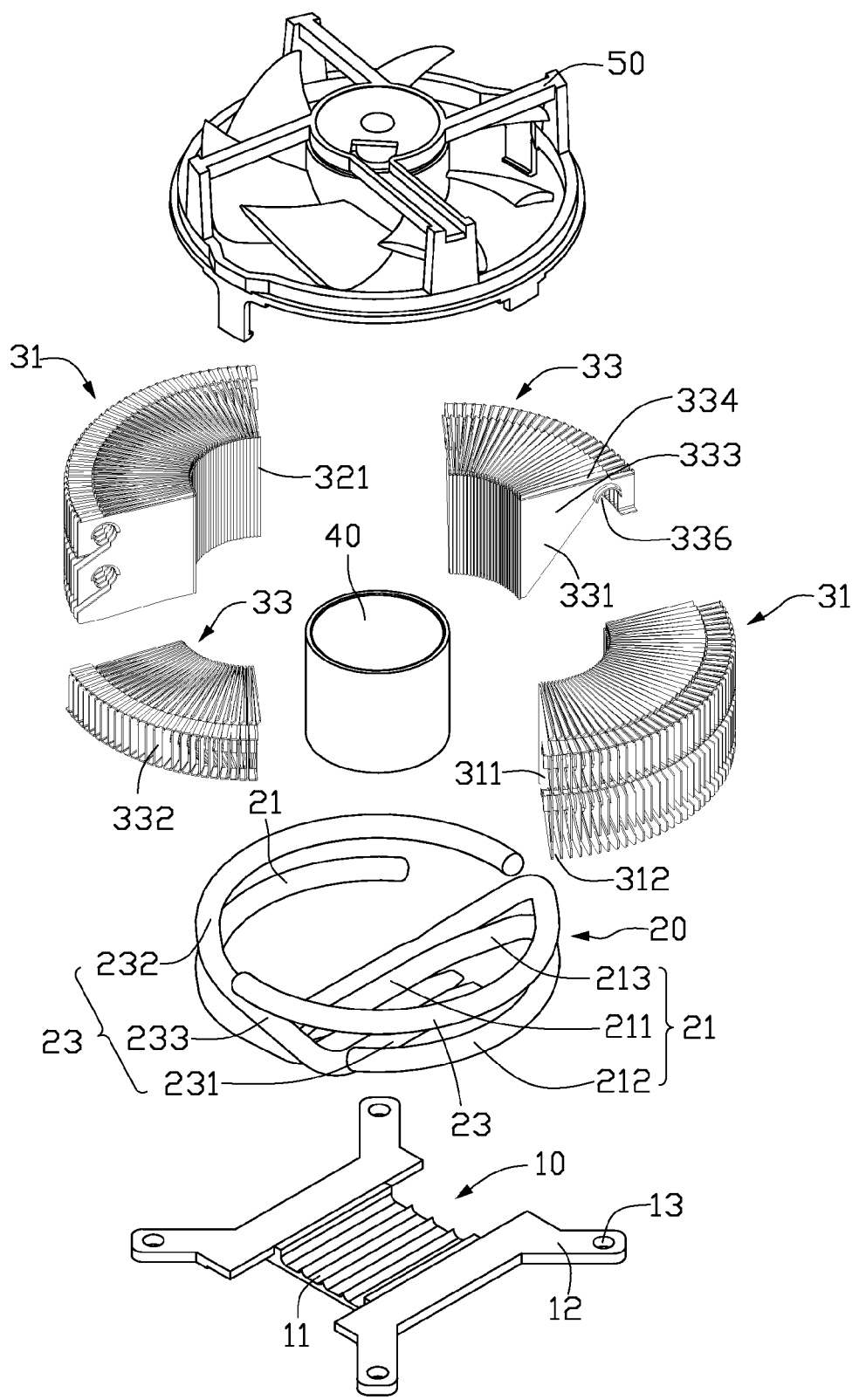
FIG. 2 is an exploded, isometric view of the heat dissipation apparatus of FIG. 1.

Referring to FIGS. 1 and 2, a heat dissipation apparatus in accordance with one embodiment of the disclosure is shown. The heat dissipation apparatus includes a base 10, a heat sink 30, a heat pipe assembly 20 thermally connecting the base 10 with the heat sink 30, a cylindrical heat conductive core 40 received in the heat sink 30, and a fan 50 mounted on the heat sink 30.

The base 10 is a metal plate, and has a high heat conductivity. Preferably, the base 10 is made of copper. The base 10 thermally connects with a heat generating electronic component at a bottom surface thereof, and attaches to the heat pipe assembly 20 at a top surface thereof. A number of grooves 11 are defined in the top surface of the base 10 for accommodating the heat pipe assembly 20. In this embodiment, the base 10 defines four parallel grooves 11 thereon. It is to be understood that the number of the grooves 11 should be the same as that of the heat pipes of the heat pipe assembly 20. A securing arm 12 extending outwardly from each corner of the base 10 defines a securing hole 13 therein for assembly of the heat dissipation apparatus to a circuit board on which the electronic component is mounted.

The heat pipe assembly 20 includes a pair of first heat pipes 21 and a pair of second heat pipes 23. Each of the first heat pipes 21 is bent to have an evaporation section 211, a condensation section 212, and an adiabatic section 213 interconnecting the evaporation section 211 and the condensation section 212. The evaporation section 211 of each of the first heat pipes 21 is straight and flat, and is mounted in one groove 11 of the top surface of the base 10. The adiabatic section 213 extends upwardly and slantwise from one end of the evaporation section 211. The condensation section 212 is substantially semicircular, and extends from a free end of the adiabatic section 213 along a clockwise direction. The evaporation sections 231 of the first heat pipes 21 are arranged in the middle two grooves 11, the adiabatic sections 233 are located at two opposite sides of the base 11, and the condensation sections 232 are approximately at the same level and cooperatively form a circle.

The second heat pipes 23 are similar to the first heat pipes 21, each also including an evaporation section 231, a condensation section 232, and an adiabatic section 233 interconnecting the evaporation section 231 and the condensation section 232. The evaporation sections 231 of the second heat pipes 23 are arranged in the outmost two grooves 11 of the base 10. An angle formed between the evaporation section 231 and the adiabatic section 233 of the second heat pipe 23 is greater than that of the first heat pipe 21. A free end of the adiabatic section 233 of the second heat pipe 23 is higher than that of the first heat pipe 21. The condensation sections 232 of the second heat pipes 23 are at the same level, and higher than the condensation sections 212 of the first heat pipe 21. Similarly, the condensation sections 232 of the second heat pipes 23 cooperatively form a circle.

The heat sink 30 is annular, and includes a pair of first fin assemblies 31 and a pair of second fin assemblies 33.

Figure 3:
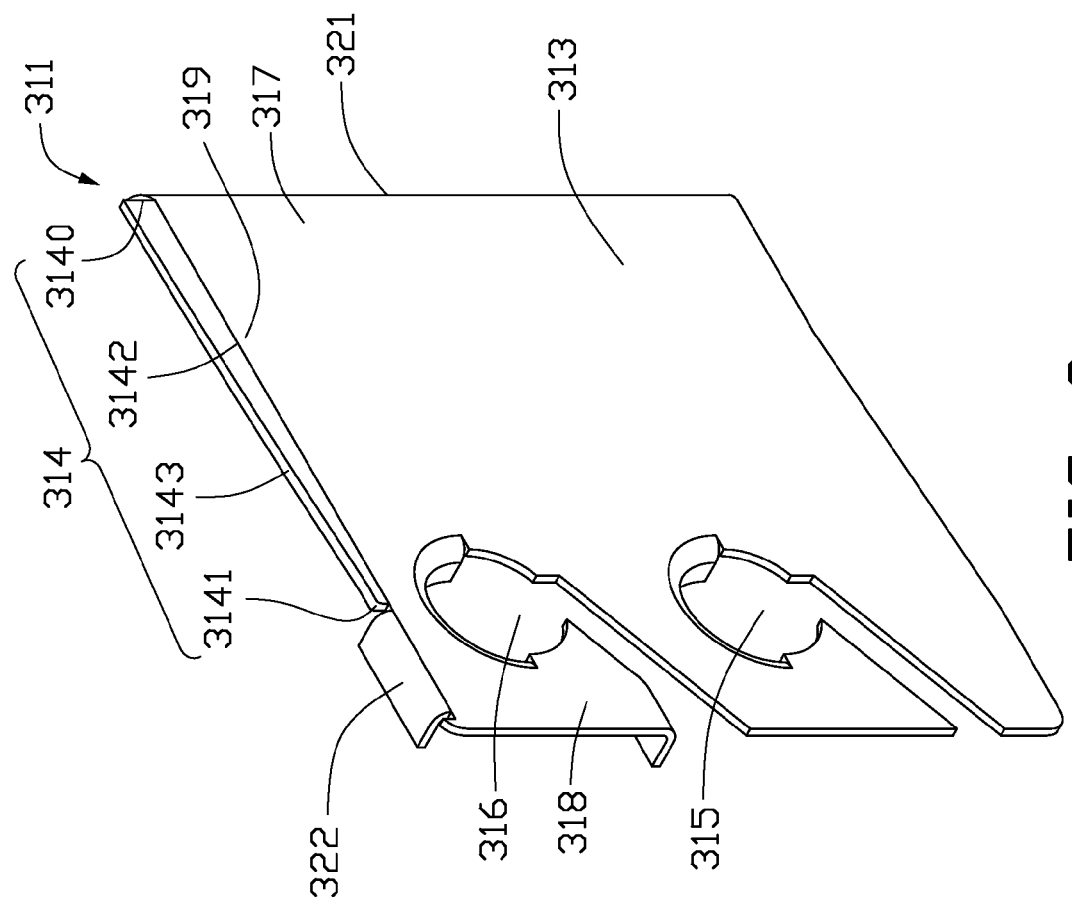
FIG. 3 is an isometric view of one first fin of a first fin assembly of the heat dissipation apparatus of FIG. 1.

Each of the first fin assemblies 31 is sectorial, and includes a stacked plurality of first fins 311. An air channel 312 is defined between every two adjacent first fins 311. Referring to FIG. 3, each of the first fins 311 includes a rectangular main body 313, an inner edge 321 (shown in FIG. 2) at an inner side 317 of the main body 313, and an airflow guiding flange 314 and a top edge 322 at a top side 319 of the main body 313. The main body 313 defines a first receiving hole 315 and a second receiving hole 316 above the first receiving hole 315, for receiving the first heat pipe 21 and the second heat pipe 23 therein, respectively. The inner edge 321 and the top edge 322 extend perpendicularly and outwardly from the main body 313. Distal edges of the inner edge 321 and the top edge 322 of each of the first fins 312 abut the main body 313 of a neighboring first fin 312 when the first fin assembly 31 is assembled.

The airflow guiding flange 314 extends upwardly and outwardly from the main body 313. The airflow guiding flange 314 is twisted in a radial direction, such that an included angle between the airflow guiding flange 314 and the main body 313 is gradually decreased from the inner side 317 towards an outer side 318 of the main body 313. In the present embodiment, the airflow guiding flange 314 includes a first short side 3140, a second short side 3141, a first long side 3142 and a second long side 3143. The first and second long sides 3142, 3143 interconnect the first and second short sides 3140, 3141. The first long side 3142 overlaps with the top side 319 of the main body 313. The second long side 3143 is curved. The first and second short sides 3140, 3141 are adjacent to the inner and outer sides 317, 318 of the main body 313, respectively. The first and second short sides 3140, 3141 are noncoplanar with each other. The first short side 3140 is vertical and coplanar with the main body 313, such that an included angle between the first short side 3140 and the main body 313 is 180 degrees. The second short side 3141 is aslant, and an included angle between the second short side 3141 and the main body 313 is 135 degrees. In other words, the included angle between the airflow guiding flange 314 and the main body 313 is gradually decreased from 180 degrees at the inner side 317 of the main body 313 to 135 degrees at the outer side 318 of the main body 313. The first and second short sides 3140, 3141 have the same height in a vertical direction.

Referring again to FIG. 2, the second fin assemblies 33 are similar to the first fin assemblies 31, each also being sectorial, and including a stacked plurality of second fins 331. An air channel 332 is defined between every two adjacent second fins 331. Each of the second fins 331 includes a main body 333, an airflow guiding flange 334, an inner edge 341 and a top edge 342 (shown in FIG. 4). The main body 331 has an inner side 337 and an outer side 338. The airflow guiding flange 334, the inner edge 341 and the top edge 342 each have the same structure as that of the airflow guiding flange 314, the inner edge 321 and the top edge 322 of each of the first fins 311. The difference between the second fin assemblies 33 and the first fin assemblies 31 is that the main body 333 of the second fin 331 is substantially triangular, and thus defines a cutout 348 at an outer-down side thereof. In addition, the main body 333 defines only one receiving hole 336 therein aligning with the second receiving hole 316 of the first fin 311. The receiving hole 336 is in communication with the cutout 348.

Figure 4:
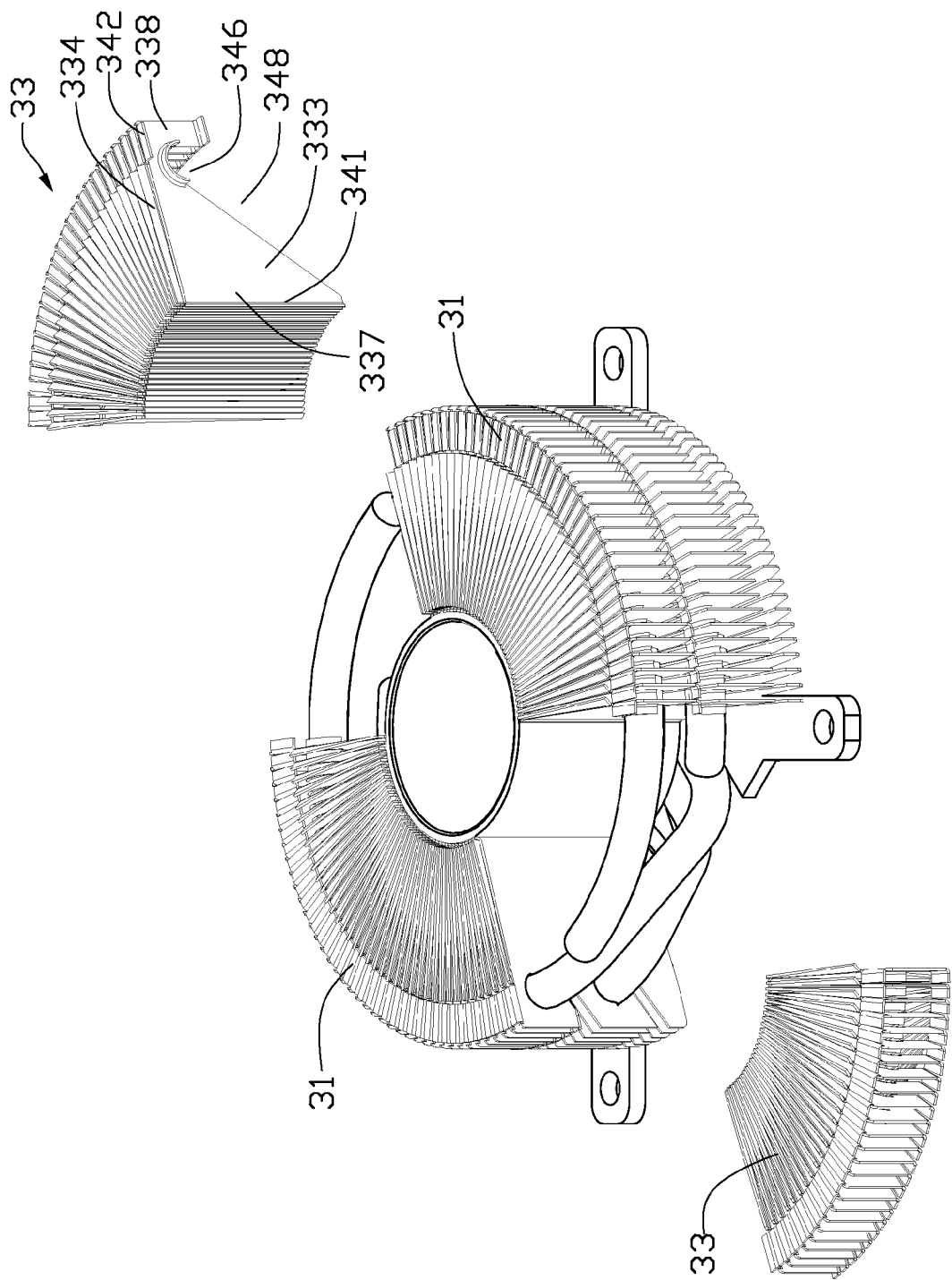
FIG. 4 is an isometric view showing the first fin assembly assembled to a heat pipe assembly of the heat dissipation apparatus of FIG. 1, and a second fin assembly disassembled from the heat pipe assembly.
Figure 5:
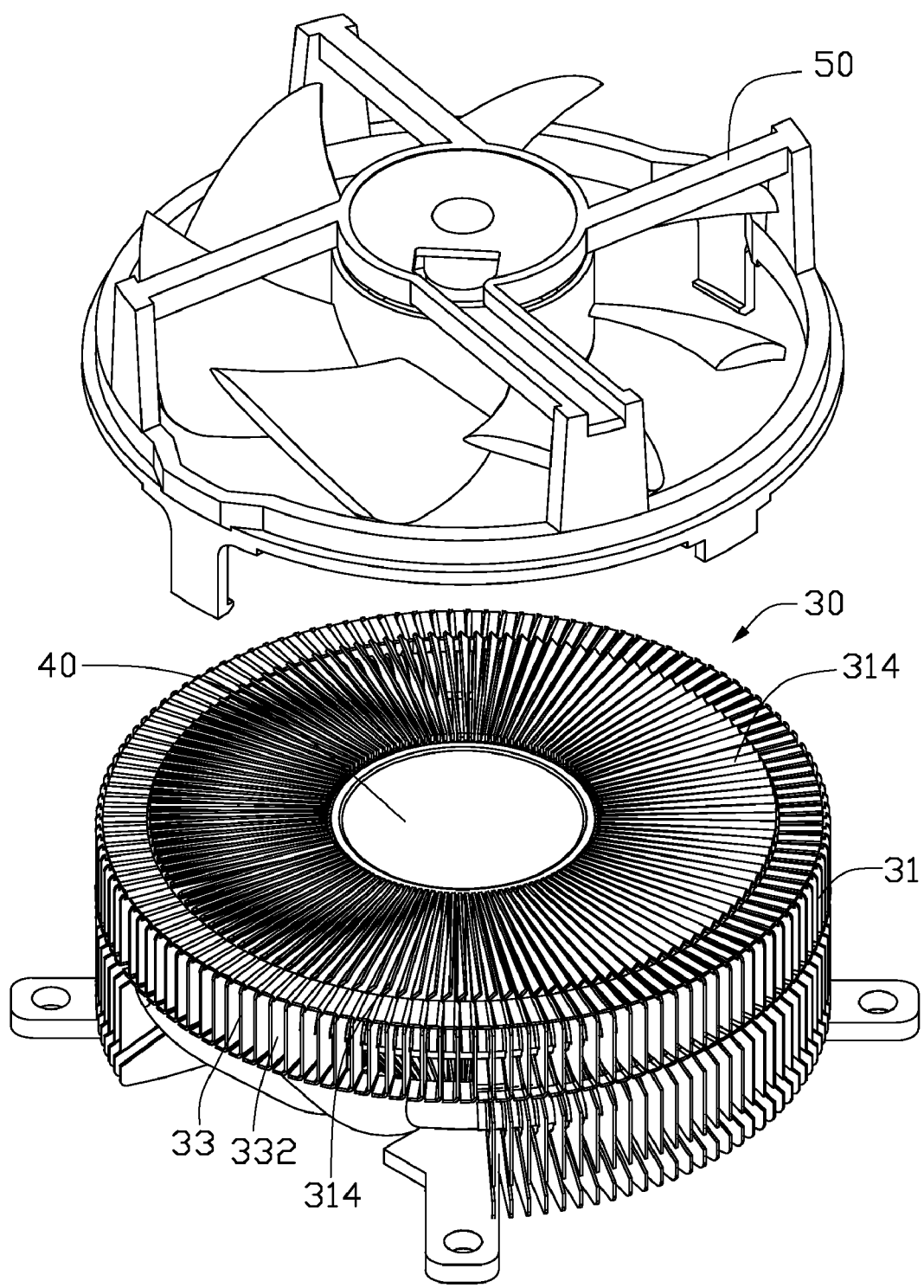
FIG. 5 is an isometric view showing a fan disassembled from the heat dissipation apparatus of FIG. 4.

Referring to FIGS. 4 and 5, during assembly of the heat dissipation apparatus, the first fin assemblies 31 are oriented face to face, and space from each other. The condensation sections 212 of the pair of the first heat pipes 21 are inserted into the first receiving holes 315 of the first fin assemblies 31 along two opposite orientations, respectively. The condensation sections 232 of the pair of the second heat pipes 23 are inserted into the second receiving holes 316 of the first fin assemblies 31 along two opposite orientations, respectively. A free end of each condensation section 212, 232 protrudes out of a corresponding first fin assembly 31. The first fin assemblies 31, and the first and second heat pipes 21, 23 are arranged on the base 10, with the evaporation sections 211, 231 of the first and second heat pipes 21, 23 received in the grooves 11 of the base 10. The second fin assemblies 33 are inserted into spaces between the first fin assemblies 31 from top to bottom, respectively. The free end of each condensation section 232 of the second heat pipes 23 enters into and is received in the receiving holes 336 through the cutouts 348 of the second fin assemblies 33. The free end of each condensation section 212 of the first heat pipes 21, and the adiabatic section 213, 233 of each first and second heat pipe 21, 23 are received in the cutouts 348. At this time, the first fin assemblies 31 and the second fin assemblies 33 are staggered with each other, and cooperatively form the annular heat sink 30. The airflow guiding flanges 314, 334 of the first and second fin assemblies 31, 33 also cooperatively form an annular structure. The heat conductive core 40 is enclosed by the first and second fin assemblies 31, 33. The heat conductive core 40 attaches to the evaporation sections 211, 231 of the first and second heat pipes 21, 23 at a bottom surface thereof, and attaches to the inner edges 321, 341 of the first and second fin assemblies 31, 33 at a side surface thereof. The first and second fins 311, 331 of the first and second fin assemblies 31, 33 extend out from the heat conductive core 40 in a radial pattern. The fan 50 is mounted on the heat sink 30, with the airflow guiding flanges 314, 334 of the first and second fin assemblies 31, 33 oriented windward of airflow from fan 50.

During operation of the heat dissipation apparatus, the base 10 absorbs heat from the heat generating electronic component, which is transferred to the heat sink 30 via the heat conductive core 40 and the heat pipe assembly 20. The fan 50 generates airflow towards the heat sink 30, and dissipates heat from the heat sink 30 into ambient air.

In the heat dissipation apparatus, the airflow guiding flanges 314, 334 extend upwardly and outwardly in a twisted manner from the main bodies 313, 333 of the first and second fins 311, 331, and towards windward of the airflow from the fan 50. Thus, the airflow produced by the fan 50 is easily guided into the air channels 312, 332 between the first and second fins 311, 331, improving efficiency of the forced convention between the fins 311, 331 and the airflow. In addition, since the first and second fins 311, 331 extend out from the heat conductive core 40 in a radial pattern, the air channels 312, 332 between the first and second fins 311, 331 are gradually reduced from the outer sides 318, 338 towards the inner sides 317, 337 of the main bodies 313, 333. However, in the present heat dissipation apparatus, the airflow guiding flange 314, 334 is twisted, and the included angle between the airflow guiding flange 314, 334 and the corresponding main body 313, 333 is gradually decreased from the inner side 317, 337 towards the outer side 318, 338 of the main body 313, 333. A gap between every two adjacent airflow guiding flanges 314, 334 is relatively gradually increased from the outer side 318, 338 towards the inner side 317, 337, which counteracts the diminishing air channels 312, 332 from the outer side 318, 338 towards the inner side 317, 337. Thus, resistance to the airflow entering the air channels 312, 332 is reduced, and efficiency of the airflow in dissipating heat from the heat sink 30 is improved.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation apparatus, comprising:
   a heat sink comprising a plurality of radial fins, with an air channel between every two adjacent fins, at least some of the fins each comprising a main body and an airflow guiding flange extending upwardly and outwardly from a top side of the main body, the airflow guiding flange twisted in a radial direction, included angles defined between the airflow guiding flange and the main body gradually decreased from an inner side towards an outer side of the main body; and
   a fan mounted on the heat sink, for generating airflow towards the heat sink, with the airflow guided into the air channels between the fins via the airflow guiding flange;
   wherein the heat sink comprises a pair of first fin assemblies staggered with a pair of second fin assemblies, each of the first fin assemblies comprising a plurality of first fins, each of the second fin assemblies comprising a plurality of second fins, and the first fins and the second fins cooperatively forming the radial fins.

2. The heat dissipation apparatus of claim 1, wherein the airflow guiding flange comprises a first short side, a second short side, a first long side and a second long side, the first long side overlapping with the top side of the main body, the first and second short sides respectively located adjacent to the inner and outer sides of the main body, the first and second short sides being noncoplanar with each other.

3. The heat dissipation apparatus of claim 2, wherein the first short side is coplanar with the main body, an included angle between the first short side and the main body being 180 degrees, the second short side being aslant, an included angle between the second short side and the main body being 135 degrees.

4. The heat dissipation apparatus of claim 1, wherein the airflow guiding flange comprises a first long side and a second long side opposite to the first long side, the first long side overlapping with the top side of the main body, the second long side being curved.

5. The heat dissipation apparatus of claim 4, wherein the first and second short sides have the same height in a vertical direction.

6. The heat dissipation apparatus of claim 1, further comprising a pair of first heat pipes and a pair of second heat pipes thermally connecting with the heat sink, each of the first and second heat pipes comprising an evaporation section, a condensation section and an adiabatic section interconnecting the evaporation section and the condensation section.

7. The heat dissipation apparatus of claim 6, wherein the condensation sections of the first heat pipes cooperatively form a circle, and the condensation sections of the second heat pipes cooperatively form a circle, the condensation sections of the second heat pipes being higher than the condensation sections of the first heat pipes.

8. The heat dissipation apparatus of claim 7, wherein each of the first fin assemblies comprises a first receiving hole and a second receiving hole above the first receiving hole, and each of the second fin assemblies comprises a receiving hole and a cutout in communication with the receiving hole, the condensation sections of the second heat pipes received in the second receiving holes of the first fin assemblies and the receiving holes of the second fin assemblies, the condensation sections of the first heat pipes received in the first receiving holes of the first fin assemblies, and the adiabatic sections of the first and second heat pipes received in the cutouts.

9. The heat dissipation apparatus of claim 1, further comprising a heat conductive core, the first and second fins extending radially and outwardly from the heat conductive core.

\* \* \* \* \*